United States Patent
Banine et al.

(10) Patent No.: US 9,097,982 B2
(45) Date of Patent: Aug. 4, 2015

(54) RADIATION SYSTEM, RADIATION COLLECTOR, RADIATION BEAM CONDITIONING SYSTEM, SPECTRAL PURITY FILTER FOR RADIATION SYSTEM AND METHOD FOR FORMING A SPECTRAL PURITY FILTER

(75) Inventors: Vadim Yevgenyevich Banine, Deurne (NL); Wilhelmus Petrus De Boeij, Veldhoven (NL); Antonius Johannes Josephus Van Dijsseldonk, Hapert (NL); Erik Roelof Loopstra, Eindhoven (NL); Jan Bernard Plechelmus Van Schoot, Eindhoven (NL); Gerardus Hubertus Petrus Maria Swinkels, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 356 days.

(21) Appl. No.: 12/994,930

(22) PCT Filed: May 5, 2009

(86) PCT No.: PCT/EP2009/055380
§ 371 (c)(1),
(2), (4) Date: Nov. 29, 2010

(87) PCT Pub. No.: WO2009/144117
PCT Pub. Date: Dec. 3, 2009

(65) Prior Publication Data
US 2011/0223543 A1    Sep. 15, 2011

Related U.S. Application Data

(60) Provisional application No. 61/057,704, filed on May 30, 2008.

(51) Int. Cl.
*G03F 7/20* (2006.01)

(52) U.S. Cl.
CPC ........ *G03F 7/70191* (2013.01); *G03F 7/70116* (2013.01); *G03F 7/70575* (2013.01)

(58) Field of Classification Search
CPC ............ G03F 7/70116; G03F 7/70191; G03F 7/70575
USPC .............. 430/321, 323; 216/24; 359/359, 360
See application file for complete search history.

(56) References Cited

U.S. PATENT DOCUMENTS 5,238,785 A  *  8/1993  Ohkura et al. ................ 430/321
7,897,305 B2      3/2011  Lee et al.
(Continued)

FOREIGN PATENT DOCUMENTS

CN    1991590 A       7/2007
CN    101078787 A    11/2007
(Continued)

OTHER PUBLICATIONS

English translation of Chinese Office Action for Chinese Patent Application No. 200980120016.3, mailed on May 3, 2012.
(Continued)

*Primary Examiner* — John A McPherson
(74) *Attorney, Agent, or Firm* — Pillsbury Winthrop Shaw Pittman LLP

(57) ABSTRACT

A radiation system is configured to generate a radiation beam. The radiation system comprising a chamber that includes a radiation source configured to generate radiation, a radiation beam emission aperture, and a radiation collector configured to collect radiation generated by the source, and to transmit the collected radiation to the radiation beam emission aperture. The radiation collector includes a spectral purity filter configured to enhance a spectral purity of the radiation to be emitted via the aperture.

20 Claims, 8 Drawing Sheets

(56) References Cited

U.S. PATENT DOCUMENTS

| | | | |
|---|---|---|---|
| 2002/0149751 A1* | 10/2002 | Bloomstein et al. | 353/122 |
| 2003/0058529 A1 | 3/2003 | Goldstein | 359/361 |
| 2005/0275818 A1 | 12/2005 | Singer | 355/55 |
| 2006/0152701 A1 | 7/2006 | Totzeck et al. | 355/71 |

FOREIGN PATENT DOCUMENTS

| | | |
|---|---|---|
| CN | 101118298 A | 2/2008 |
| EP | 0 490 320 A2 | 6/1992 |
| EP | 1 333 323 | 8/2003 |
| EP | 1 369 714 | 12/2003 |
| EP | 1 439 426 | 7/2004 |

OTHER PUBLICATIONS

International Search Report as issued for PCT/EP2009/055380, dated Aug. 3, 2009.

Chinese Office Action dated Jan. 18, 2013 in corresponding Chinese Patent Applciation No. 200980120016.3.

European Office Action dated Jun. 13, 2013 in corresponding European Patent Application No. 09753772.4.

Chinese Office Action dated Jul. 19, 2013 in corresponding Chinese Patent Application No. 200980120016.3.

* cited by examiner though the final delivered product may be one in which it has to undergo certain preparation steps (such as, for example, the developing of a resist, a post-exposure bake (PEB), etching, a metrology step, etc.).
RADIATION SYSTEM, RADIATION COLLECTOR, RADIATION BEAM CONDITIONING SYSTEM, SPECTRAL PURITY FILTER FOR RADIATION SYSTEM AND METHOD FOR FORMING A SPECTRAL PURITY FILTER

CROSS-REFERENCE TO RELATED APPLICATIONS

This application is the National Phase entry of PCT/EP2009/055380, which claims the benefit of US provisional application 61/057,704, which was filed on 30 May 2008, and which is incorporated herein in its entirety by reference.

FIELD

The present invention relates to a radiation system, a radiation collector, a radiation beam conditioning system, a spectral purity filter for a radiation system and a method of forming a spectral purity filter.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings. Along with useful EUV in-band radiation, EUV radiation sources may produce almost equal (and sometimes more) undesirable out-of-band infrared ("IR") and deep ultraviolet ("DUV") radiation.

Spectral purity filters have been developed to filter the non-EUV radiation out of the beam of radiation to be used for exposure. However, the spectral purity filters that have been developed may not be able to withstand high heat loads, may be limited in size, and may not provide the desired filtering.

SUMMARY

It is desirable to provide an improved radiation system. It is also desirable to provide a radiation system that can generate a spectrally sufficiently pure radiation beam to be used in lithography. It is also desirable to provide a durable radiation system that can generate a pure beam of extreme ultraviolet (EUV) radiation by altering the path of the unwanted radiation out of the radiation beam.

According to an embodiment of the present invention, there is provided a spectral purity filter configured to reflect radiation having a first wavelength in a first direction and to reflect radiation having a second wavelength in a second direction that is different from the first direction. The spectral purity filter comprises a base substrate and a multilayer stack on the base substrate. The multilayer stack comprises a plurality of alternating layers and a plurality of recesses in a top side of the multilayer stack. The recesses are configured to allow the radiation having the first wavelength to be reflected in the first direction and to reflect the radiation having the second wavelength in the second direction. The recesses are configured such that, in cross-section, they have a symmetric profile.

According to an embodiment of the present invention, there is provided a radiation system configured to generate a radiation beam. The radiation system includes a chamber that includes a radiation source configured to generate radiation, a radiation beam emission aperture, and a radiation collector configured to collect radiation generated by the source, and to transmit the collected radiation to the radiation beam emission aperture. The radiation collector includes a spectral purity filter as above, configured to enhance a spectral purity of the radiation to be emitted via the aperture.

According to an embodiment of the present invention, there is provided a radiation collector configured to collect radiation generated by a radiation source configured to generate extreme ultraviolet radiation, and to transmit the collected radiation to an intermediate focus of a radiation system. The radiation collector includes a spectral purity filter as above, configured to enhance a spectral purity of the extreme ultraviolet radiation.

According to an embodiment of the present invention, there is provided a radiation beam conditioning system, configured for conditioning a beam of radiation in a lithographic apparatus, comprising first and second arrays of reflectors. Each reflector of the first array of reflectors is configured to direct radiation from an intermediate point of focus of the beam of radiation onto one of the reflectors of the second array of reflectors. The reflectors of the second array of reflectors are configured to project radiation into a conditioned beam of radiation to be provided by the radiation beam conditioning device. At least one of the reflectors of the first and second reflectors is provided with a spectral purity filter configured to reflect radiation having a first wavelength in a first direction and to reflect radiation having a second wavelength in a second direction that is different from the first direction. The spectral purity filter comprises a base substrate and a multilayer stack on the base substrate. The multilayer stack comprising a plurality of alternating layers and a plurality of recesses in a top side of the multilayer stack. The recesses are configured to allow the radiation having the first wavelength to be reflected in the first direction and to reflect the radiation having the second wavelength in the second direction.

According to an embodiment of the present invention there is provided a method of forming a spectral purity filter, comprising: forming a layer of radiation sensitive material on a substrate; exposing an interference pattern of radiation on the radiation sensitive material; developing the radiation sensitive material to form a patterned mask on the substrate; etching the surface of the substrate on which the mask is formed in order to form a textured surface; and providing on the textured surface a multilayer stack comprising a plurality of alternating layers, the multilayer stack being configured to be reflective to extreme ultraviolet radiation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
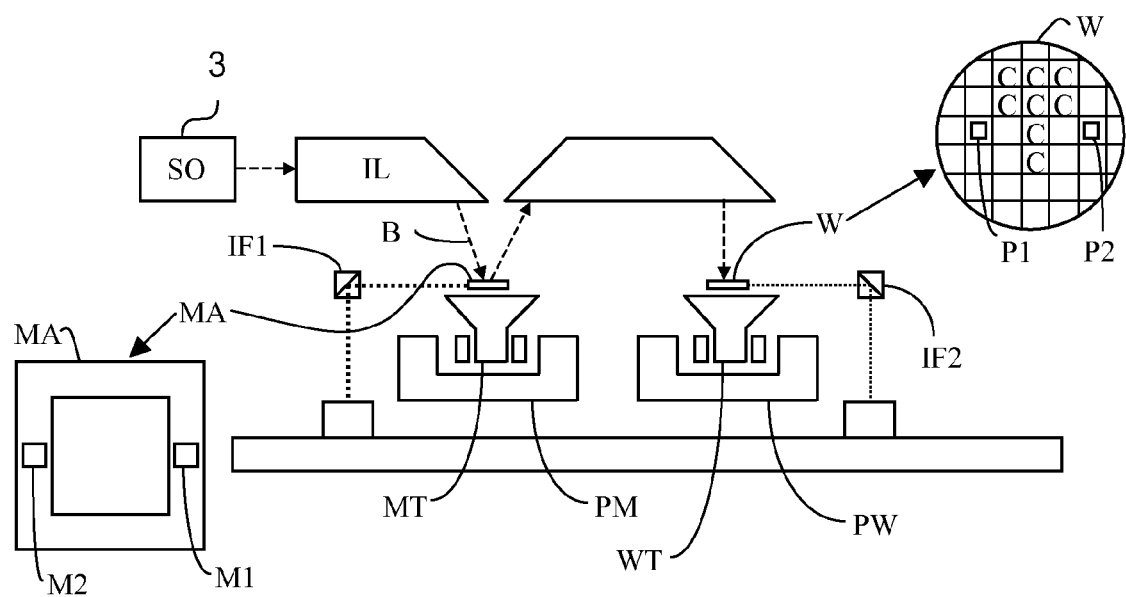
FIG. 1 depicts a lithographic apparatus in accordance with an embodiment of the invention.

FIG. 1 schematically depicts an embodiment of a lithographic apparatus, that can be or include an embodiment of the invention. The apparatus includes an illumination system (illuminator) IL configured to condition a radiation beam B (e.g. EUV radiation); a support structure or patterning device support (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO may be part of a radiation system 3 (i.e. radiation generating unit 3). The radiation system 3 and the lithographic apparatus may be separate entities. In such cases, the radiation system 3 is not considered to form part of the lithographic apparatus and the radiation beam is passed from the source SO of radiation system 3 to the illuminator IL with the aid of a beam delivery system including, for example, suitable directing mirrors and/ or a beam expander. In other cases, the source may be an integral part of the lithographic apparatus The source SO of the radiation system 3 may be configured in various ways. For example, the source SO may be a laser produced plasma source (LPP source), for example a Tin LPP source (such LPP sources are known per se) or a discharge-produced plasma source (DPP source). The source SO may also be a different type of radiation source.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
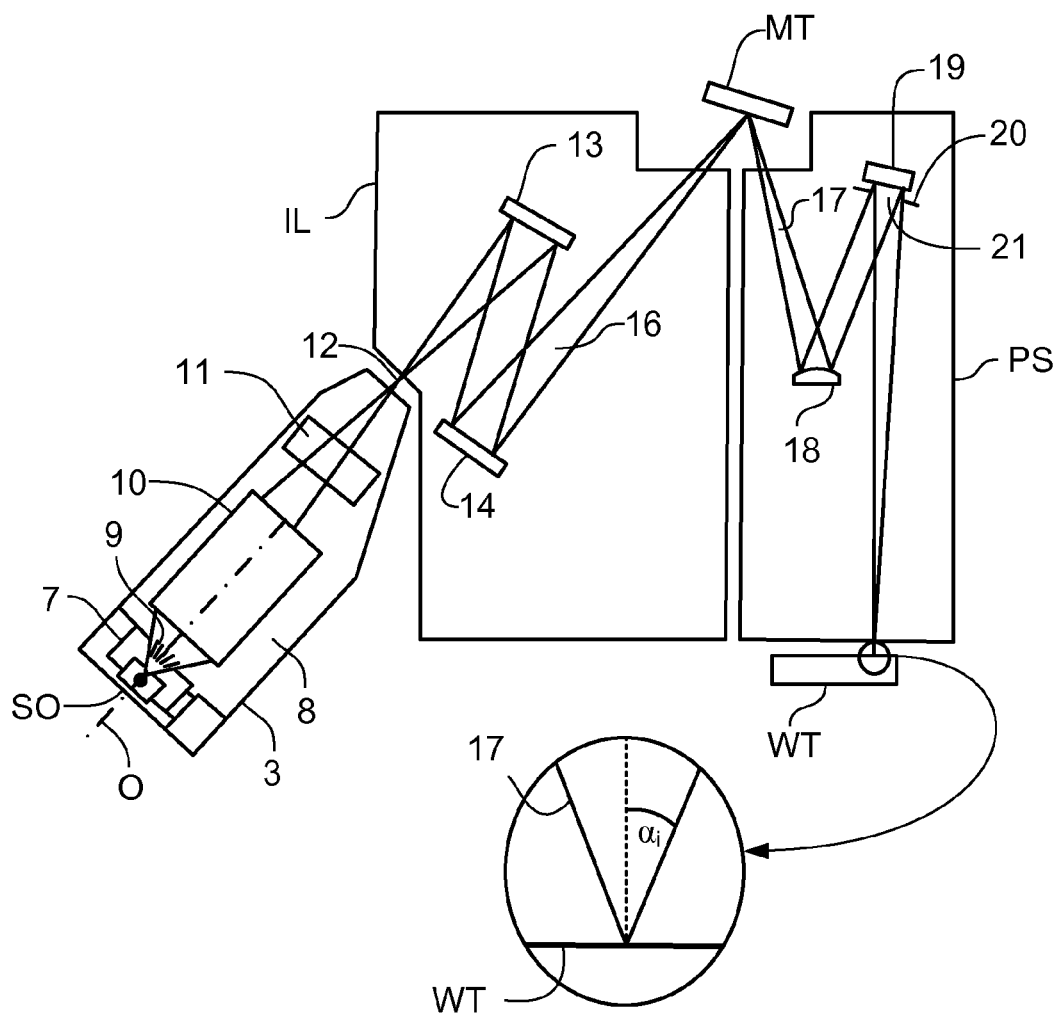
FIG. 2 depicts a lithographic apparatus in accordance with an embodiment of the invention.

FIG. 2 schematically shows a further embodiment of an EUV lithographic apparatus, having a principle of operation that is similar to the operation of the apparatus shown in the embodiment of FIG. 1. In the embodiment of FIG. 2, the apparatus includes a source-collector-module or radiation unit 3 (also referred to herein as a radiation system), an illumination system IL and a projection system PS. According to an embodiment, radiation unit 3 is provided with a radiation source SO, preferably a laser produced plasma ("LPP") source. In the present embodiment, the radiation emitted by radiation source SO may be passed from the source chamber 7 into a chamber 8 via a gas barrier or "foil trap" 9. In FIG. 2, the chamber 8 includes a radiation collector 10.

FIG. 2 depicts the application of a grazing incidence collector 10. However, the collector may be a normal incidence collector, particularly in the case the source is a LPP source. In yet another embodiment, the collector may a Schwarzschild collector (see FIG. 4), and the source may be a DPP source.

The radiation may be focused in a virtual source point 12 (i.e. an intermediate focus IF) from an aperture in the chamber 8. From chamber 8, the radiation beam 16 is reflected in illumination system IL via normal incidence reflectors 13,14 onto a patterning device (e.g. reticle or mask) positioned on support structure or patterning device support (e.g. reticle or mask table) MT. A patterned beam 17 is formed which is imaged by projection system PS via reflective elements 18,19 onto wafer stage or substrate table WT. More elements than shown may generally be present in the illumination system IL and projection system PS.

One of the reflective elements 19 may have in front of it a numerical aperture (NA) disc 20 having an aperture 21 therethrough. The size of the aperture 21 determines the angle $\alpha_i$ subtended by the patterned radiation beam 17 as it strikes the substrate table WT.

In other embodiments, the radiation collector is one or more of a collector configured to focus collected radiation into the radiation beam emission aperture; a collector having a first focal point that coincides with the source and a second focal point that coincides with the radiation beam emission aperture; a normal incidence collector; a collector having a single substantially ellipsoid radiation collecting surface section; and a Schwarzschild collector having two radiation collecting surfaces.

Also, in another embodiment, the radiation source SO may be a laser produced plasma (LPP) source including a light source that is configured to focus a beam of coherent light, of a predetermined wavelength, onto a fuel.

Figure 3:
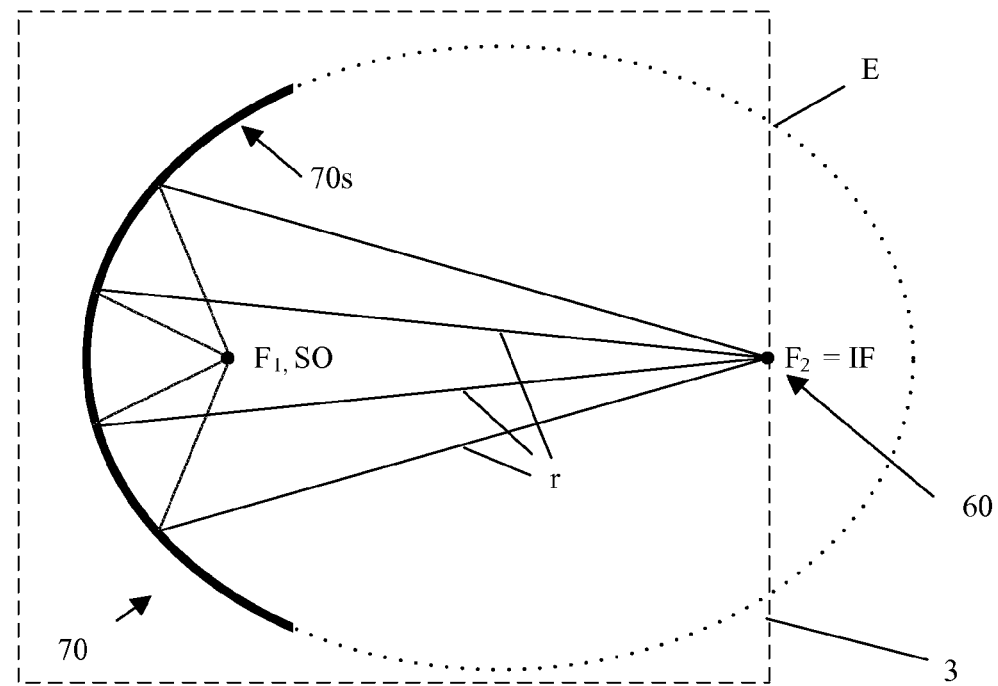
FIG. 3 depicts a radiation source and a normal incidence collector in accordance with an embodiment of the invention.

For example, FIG. 3 shows an embodiment of a radiation source unit 3, in cross-section, including a normal incidence collector 70. The collector 70 has an elliptical configuration, having two natural ellipse focus points F1, F2. Particularly, the normal incidence collector includes a collector having a single radiation collecting surface 70s having the geometry of the section of an ellipsoid. In other words: the ellipsoid radiation collecting surface section extends along a virtual ellipsoid (part of which is depicted by as dotted line E in the drawing).

As will be appreciated by the skilled person, in case the collector mirror 70 is ellipsoidal (i.e., including a reflection surface 70s that extends along an ellipsoid), it focuses radiation from one focal point F1 into another focal point F2. The focal points are located on the long axis of the ellipsoid at a distance $f=(a^2-b^2)1/2$ from the center of the ellipse, where $2a$ and $2b$ are the lengths of the major and minor axes, respectively. In case that the embodiment shown in FIG. 1 includes an LPP radiation source SO, the collector may be a single ellipsoidal mirror as shown in FIG. 3, where the light source SO is positioned in one focal point (F1) and an intermediate focus IF is established in the other focal point (F2) of the mirror. Radiation emanating from the radiation source, located in the first focal point (F1) towards the reflecting surface 70s and the reflected radiation, reflected by that surface towards the second focus point F2, is depicted by lines r in the drawing. For example, according to an embodiment, a mentioned intermediate focus IF may be located between the collector and an illumination system IL (see FIGS. 1, 2) of a lithographic apparatus, or be located in the illumination system IL, if desired.

Figure 4:
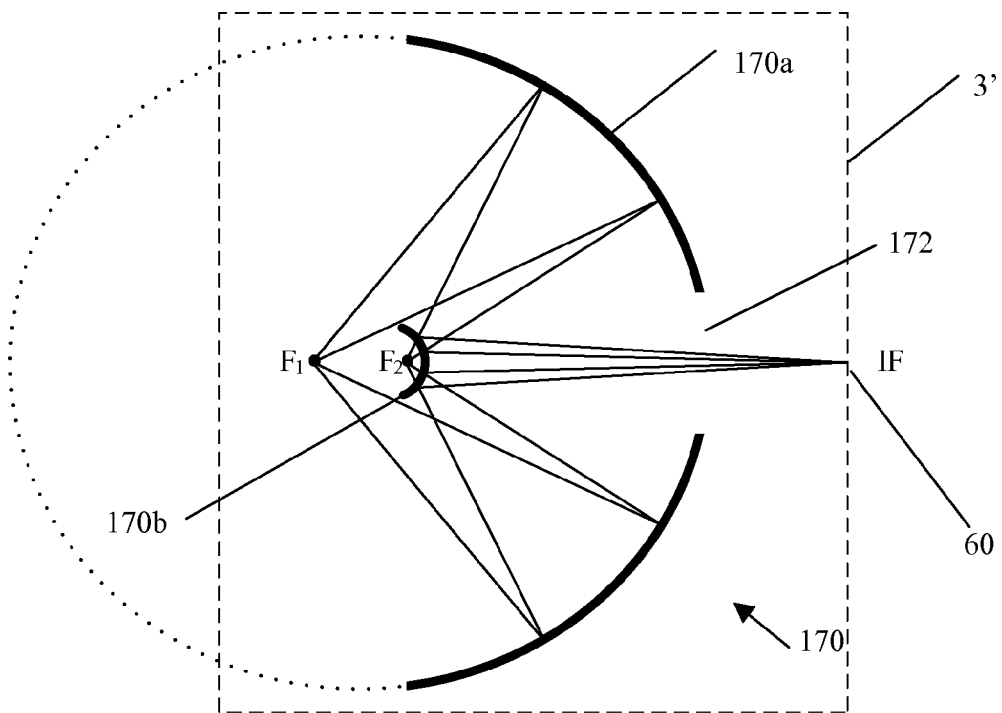
FIG. 4 depicts a radiation source and a Schwarzschild type normal incidence collector in accordance with an embodiment of the invention.

FIG. 4 schematically shows a radiation source unit 3' in accordance with an embodiment of the invention, in cross-section, including a collector 170. In this case, the collector includes two normal incidence collector parts 170a, 170b, each part 170a, 170b preferably (but not necessarily) having a substantially ellipsoid radiation collecting surface section. Particularly, the embodiment of FIG. 4 includes a Schwarzschild collector design, preferably consisting of two mirrors 170a, 170b. The source SO may be located in a first focal point F1. For example, the first collector mirror part 170a may have a concave reflecting surface (for example of ellipsoid or parabolic shape) that is configured to focus radiation emanating from the first focal point F1 towards the second collector mirror part 170b, particularly towards a second focus point F2. The second mirror part 170b may be configured to focus the radiation that is directed by the first mirror part 170a towards the second focus point F2, towards a further focus point IF (for example an intermediate focus). The first mirror part 170a includes an aperture 172 via which the radiation (reflected by the second mirror 170b) may be transmitted towards the further focus point IF. For example, the embodiment of FIG. 4 may beneficially be used in combination with a DPP radiation source.

In the present embodiment, the source SO is a LPP source, that is associated with a laser source configured to generate a laser beam of coherent light, having a predetermined wavelength. The laser light is focused onto a fuel (the fuel for example being supplied by a fuel supplier, and for example including fuel droplets) to generate radiation there-from, in a laser produced plasma process. The resulting radiation may be EUV radiation, in this embodiment. In a non-limiting embodiment, the predetermined wavelength of the laser light is 10.6 microns (i.e. μm). For example, the fuel may be tin (Sn), or a different type of fuel, as will be appreciated by the skilled person.

The radiation collector 70 may be configured to collect radiation generated by the source, and to focus collected radiation to the downstream radiation beam emission aperture 60 of the chamber 3.

For example, the source SO may be configured to emit diverging radiation, and the collector 70 may be arranged to reflect that diverging radiation to provide a converging radiation beam, converging towards the emission aperture 60 (as in FIGS. 3 and 4). Particularly, the collector 70 may focus the radiation onto a focal point IF on an optical axis O of the system (see FIG. 2), which focal point IF is located in the emission aperture 60.

The emission aperture 60 may be a circular aperture, or have another shape (for example elliptical, square, or another shape). The emission aperture 60 is preferably small, for example having a diameter less than about 10 cm, preferably less than 1 cm, (measured in a direction transversally with a radiation transmission direction T, for example in a radial direction in case the aperture 60 has a circular cross-section). Preferably, the optical axis OX extends centrally through the aperture 60, however, this is not essential.

Because infrared radiation ("IR") that may be produced by the radiation source SO may cause heating of the mirrors downstream of the collector, as well as the reticle stage, it is desirable to filter the IR from the desired EUV radiation being provided to the patterning device MA. It may also be desirable to filter deep ultraviolet ("DUV") radiation (for example having a wavelength in a range of about 190-250 nm) from the EUV, because DUV may cause blurring of the EUV image in the resist on the substrate W.

Figure 5:
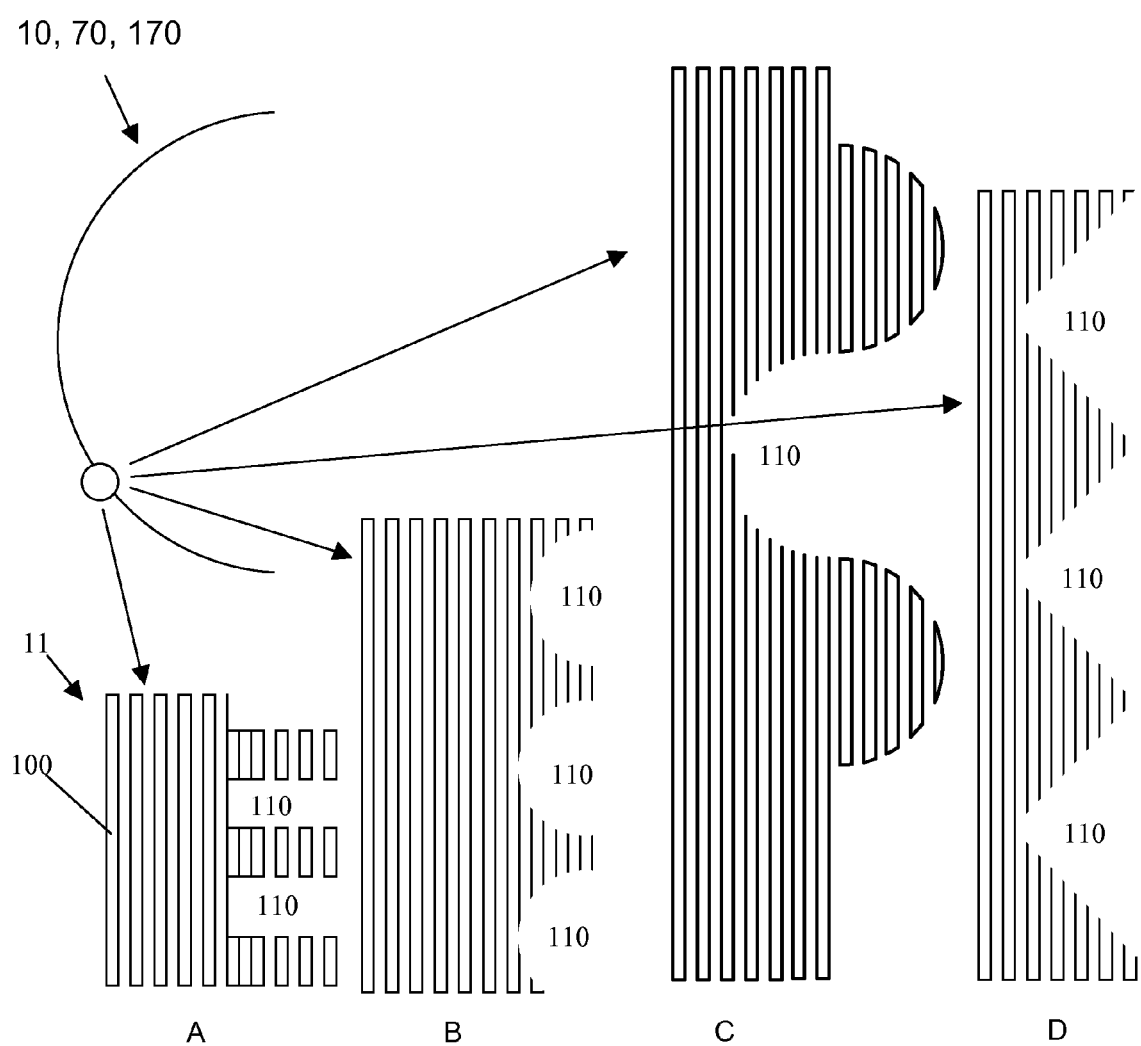
FIG. 5 depicts embodiments of a spectral purity filter that may be used in the lithographic apparatus of FIG. 1.

According to an embodiment of the present invention, a spectral purity filter 11 is provided to a mirror of the lithographic apparatus. Non-limiting embodiments of the spectral purity filter 11 are illustrated in FIG. 5 and are represented as A, B, C, and D. As discussed in further detail below, the spectral purity filter may be provided on a mirror of any of the collectors discussed above, or to a mirror in the illumination system IL, such as mirrors 18 or 19 shown in FIG. 2. It is desirable, although not necessary, for the spectral purity filter 11 to fulfill the following specification:

| Region | At IF [W] | After SPF [W] (transmission) | Absorbed + Reflected power at SPF [W] |
|---|---|---|---|
| in-band EUV | 130 | >105 | <25 |
| OoB EUV 9-21 nm | 100 | <80 | >20 |
| OoB EUV 5-130 nm | 250 | <200 | >60 |
| DUV 130-400 nm | 200 | <2 | >198 |
| VIS-NIR | 10 | <5 | >5 |
| IR | 10 | <1 | >9 |
| 10.6 um | 260 | <26 | >234 |

In order for the collector to remain reflective for radiation having a wavelength of 13.5 nm (EUV), the spectral purity filter 11 includes a coating that is applied to a smooth (e.g., polished) substrate that is typically used for the collector. The coating may comprise a plurality of layers (see FIG. 5) that alternate in material so as to create a so-called multilayer stack 100 on the smooth substrate. In an embodiment, the multilayer stack 100 may include a plurality of alternating layers in the order of about 1000 and have a total thickness of about 7 μm. Any suitable combination of materials for the alternating layers that are known in the art may be used.

After the multilayer stack 100 has been applied to the smooth substrate, a top side of the multilayer stack may be etched or sputtered away in, for example, a random square (see A in FIG. 5), a random saw (see D in FIG. 5), or a random wave pattern (see B and C in FIG. 5) to create a plurality of recesses 110 in the top side of the multilayer stack 100 thereby forming the spectral purity filter 11.

In an embodiment, the recesses 110 may have a symmetric cross-section, for example as shown in FIG. 5.

In an embodiment, the recesses 110 may have about a depth of about one-fifth of the wavelength of the undesired radiation, i.e., λ/5, and suitable profile (see FIG. 5) that allow the recesses to either scatter (about 50×), or reflect the 0 order of the undesired radiation (e.g., IR and/or DUV) in a direction that is different than the direction that the desired EUV radiation is reflected. At the same time, the EUV contrast may be determined by the plurality of alternating layers in the multilayer stack, as is known in the art. The desirable EUV radiation may be reflected to the intermediate focus IF, either directly, or with the use of additional mirrors.

The spectral purity filter 11 of FIG. 5 is configured to enhance a spectral purity of the radiation that is to be emitted via the aperture 60 (shown in FIGS. 3 and 4). In an embodiment, the filter 11 is configured to transmit only a desired spectral part of radiation towards the aperture 60. For example the filter 11 may be configured to reflect, block, or redirect other 'undesired' spectral parts of the radiation. Preferably, the filter 11 is configured to provide a combination of one or more of blocking, redirecting and reflecting other 'undesired' spectral parts of the radiation.

In accordance with an embodiment, a desired spectral part (i.e. to be emitted via the aperture 60) is EUV radiation (for example having a wavelength lower than 20 nm, for example a wavelength of 13.5 nm). The filter 11 may be configured to transmit at least 50%, preferably more than 80%, of incoming radiation (i.e. radiation that is directed towards the filter from the source SO) of that desired spectral part. For example, to filter out radiation having a wavelength λ of about 10 μm, the recesses in the top side of the multilayer stack may be about 2 μm deep (and thus about 300 pairs of multilayers deep if the stack has about 1000 pairs of alternating layers).

In an embodiment, the spectral purity filter may also include a thin coating that is provided to the top side of the multilayer stack after the recesses have been created. The coating may have a thickness of about 0.2 nm to about 1 nm. The coating may include a metal that exhibits high electrical conductivity and does not oxidize. For example, the metal may be selected from the group consisting of Ru, Pd, Pt, Rh, Ro, Ti, Au, Mo, Zr, Cu, Fe, Cr, Ni, Zn, and Ag. In an embodiment, the metal may be selected from the group consisting of Ru, Pd, Pt, Rh, Ro, Ti, and Au.

In an embodiment, a reflective multilayer stack may be deposited to a polished collector mirror. The reflective multilayer stack may be provided with a spectral purity filter by wet etching, dry etching, scratching and/or using any suitable lithographic techniques to transfer the desired spectral purity filter to the reflector surface.

In an embodiment, the reflective multilayer stack may be deposited onto a substrate and the spectral purity filter, formed as above. The substrate, including the multilayer reflector and spectral purity filter may then be attached to the polished collector mirror with, for example, a suitable adhesive.

FIGS. 8a to 8g depict a process by which the spectral purity filter of the present invention may be formed. As shown, the process commences with a substrate 300, which may, for example, be the polished collector mirror.

A reflective multilayer stack 301 is formed on a surface of the substrate 300. A layer of radiation sensitive material, such as a resist 302, is deposited on top of the reflective multilayer stack 301. An interference pattern of the radiation 303 is then projected onto the radiation sensitive layer 302. The material of the radiation sensitive layer 301 is then developed in order to produce a patterned mask 304 on the surface of the reflective multilayer stack 301. The surface is then etched, for example, chemically etched, such that the patterned mask 304 produces, under the influence of the etch, a textured surface, 305 on the surface of the reflective multilayer stack 301, forming the spectral purity filter. Finally, if required, a thin coating 306 may be formed on the topside of the multilayer stack, as discussed above.

It will be appreciated that, as discussed above, the substrate 300 may be the component on which it is desired to form the spectral purity filter, such as a reflector, alternatively, the substrate may be a separate component on which the spectral purity filter is formed and which is then attached to the component on which the spectral purity filter is desired to be located.

Figure 9:
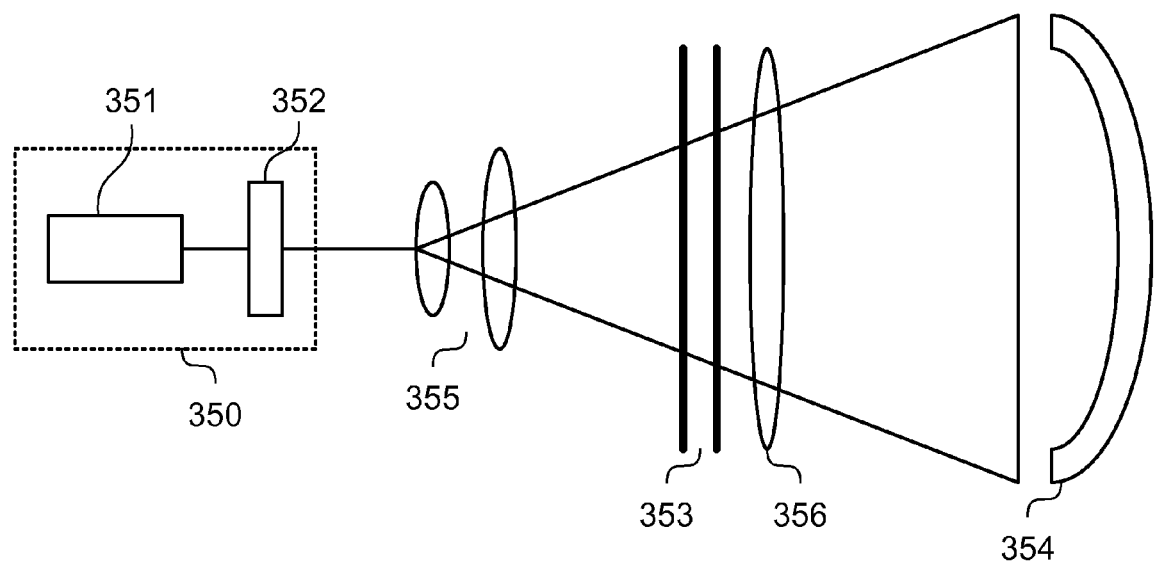
FIG. 9 depicts a system for projecting an interference pattern of radiation onto a target for use in the method depicted in FIGS. 8a to 8g.

FIG. 9 schematically depicts a system that may be used to project an interference pattern of radiation onto the substrate during the formation of a spectral purity filter using the method depicted in FIGS. 8a to 8g. It will be appreciated, however, that alternative systems may be provided in order to project an interference pattern of radiation onto the surface on which the spectral purity filter is to be formed.

As shown in FIG. 9, the system may include a narrow band source of radiation 350. For example, the narrow band source of radiation 350 may include a UV source 351 and a narrow band filter 352. The system further includes an arrangement for introducing an interference pattern into the beam of radiation produced by the narrow band source of radiation 350. For example, as depicted in FIG. 9, an etalon 353 may be provided (also known as a Fabry-Perot interferometer). In addition, optical components may be provided in order to appropriately project the interference pattern onto the target 354. For example, as shown, aspherical beam-expander optics 355 may be provided between the radiation source 350 and the etalon 353 and a field lens 356 may be provided between the etalon and the target 354.

It will be appreciated that if an arrangement such as that depicted in FIG. 9 is used, the interference pattern of radiation projected onto the target 354 may be adjusted by adjustment of the wave length of radiation used, the intensity of the beam of radiation and/or by adjusting the etalon spacing.

It should also be appreciated that the method of forming a spectral purity filter as discussed above, in particular using an arrangement such as depicted in FIG. 9 to project an interference pattern of radiation onto a substrate, may enable the formation of the requisite textured surface on a relatively large component, such as a collector mirror as discussed above. Furthermore, such a system may be beneficial because it may be applicable to the formation of a textured surface, and therefore the formation of a spectral purity filter as discussed above, on a curved surface.

According to an embodiment, the spectral purity filter 11 may be configured to filter at least part of radiation having the predetermined wavelength of the coherent laser light from the radiation source, from the radiation that is to be emitted. Particularly, a desired part of radiation that is to be emitted has a significantly lower wavelength than the coherent laser light. The wavelength of the coherent laser light may be, for example, larger than 10 microns. In an embodiment, the coherent laser light, to be filtered out, has a wavelength of 10.6 microns.

In the above, the spectral purity filter 11 has been applied in radiation systems, including a radiation collector. In an embodiment, the spectral purity filter of embodiments described herein may be applied to mirrors in the illumination system IL of the lithographic apparatus.

By combining spectral purity filter with the collector mirror, the out of band radiation may be dealt with closer to its source so that no additional EUV (or minimal) loss is realized due to implementation of filtering techniques more upstream of the so-called optical column. Because the spectral filter is positioned at the largest surface in the optical column, it may have relatively low power loads. Furthermore, a long optical path until the intermediate focus IF is available, which may allow for small diverting angles to be used to prevent the unwanted radiation from leaving the source SO and entering the illuminator IL. The spectral purity filter of embodiments of the present invention may remain working in a hostile environment and as a result may not need to be replaced by costly filters, thereby potentially saving money.

Figure 6:
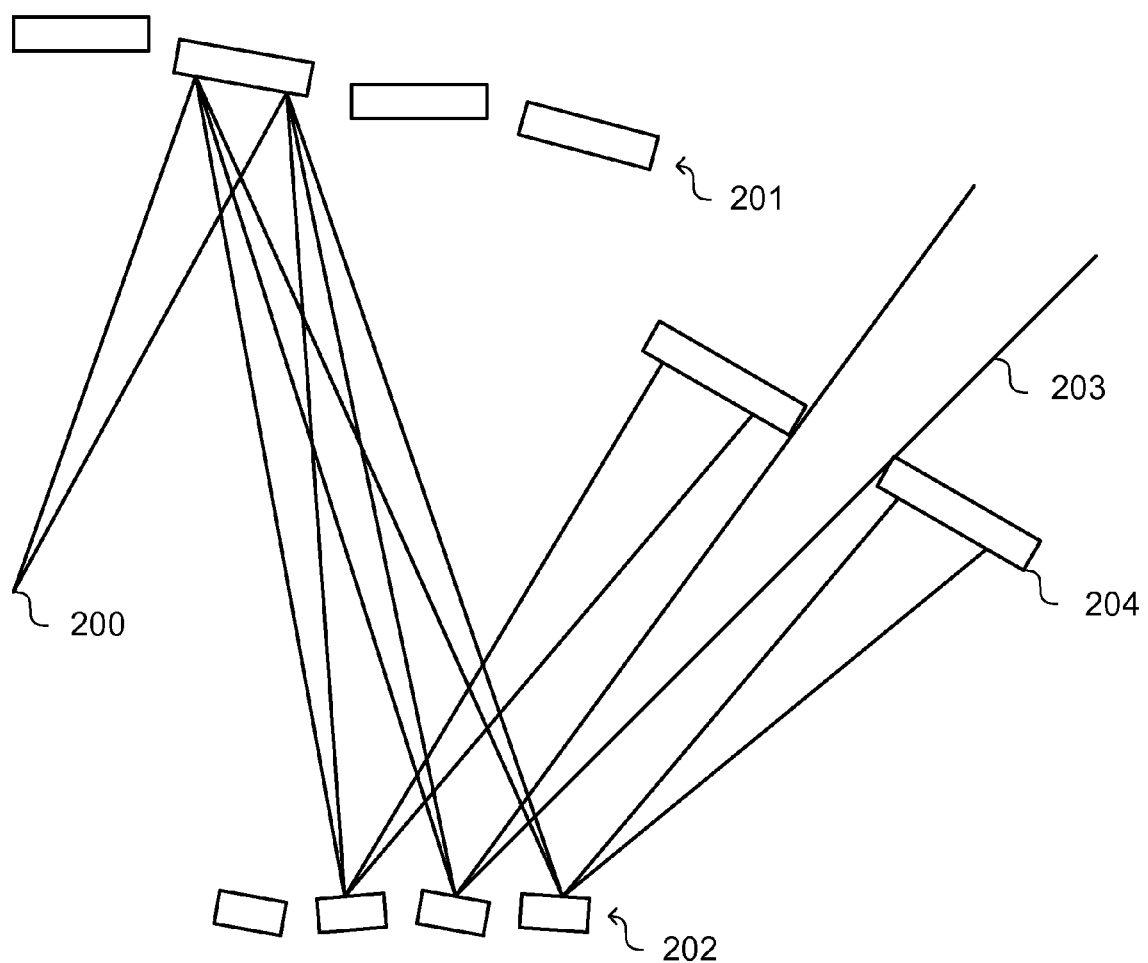
FIG. 6 depicts an arrangement of a radiation beam conditioning system using a spectral purity filter according to the present invention.

FIG. 6 depicts schematically a part of an illumination system that may be provided for use in a lithographic apparatus according to an embodiment of the present invention. In particular, the arrangement depicted in FIG. 6 may be provided in order to at least partially condition a beam of radiation.

As shown in FIG. 6, radiation is provided from a point of intermediate focus 200 to a first array of reflectors 201, which each focus a portion of the beam of radiation onto a respective reflecting element in a second array of reflecting elements 202. Each of the reflecting elements in the second array of reflecting elements 202 is configured to direct the radiation incident on the reflector of the second array of reflectors 202 into a conditioned beam of radiation 203 to be provided by the radiation beam conditioning device.

The conditioned beam of radiation 203 may be, for example, directed onto a patterning device that is used to impart a pattern to the beam of radiation as part of the lithography process. In such an arrangement, each of the reflectors in the second array of reflectors 202 may be configured such that the field of the associated element in the first array of reflectors 201 is imaged onto the patterning device. Such an arrangement is commonly known as a "fly's eye integrator". In such an arrangement, the reflectors of the first array of reflectors 201 are commonly referred to as field facet mirrors and the reflectors of the second array of reflectors 202 are commonly referred to as pupil facet mirrors. As will be appreciated, such an arrangement is configured such that the field at the patterning device (or at the outlet of the radiation beam conditioning device) consists of a plurality of overlapping images of the first array of reflectors 201. This provides a mixing of the radiation from the point of intermediate focus 200, namely of the radiation emitted by a radiation source, providing improved illumination uniformity.

In the arrangement depicted in FIG. 6, each of the reflectors of the first array of reflectors 201 is provided with a spectral purity filter according to one of the embodiments discussed above.

Furthermore, the first and second arrays of reflectors 201, 202 are configured such that radiation having the desired wavelength is reflected from each reflector of the first array of reflectors 201 to a respective reflector of the second array of reflectors 202. The respective reflectors of the second array of reflectors 202 are appropriately configured to reflect the radiation of the desired wavelength to form a part of the conditioned beam of radiation 203. Radiation of undesired wavelengths, on the other hand, is reflected from each reflector of the first array of reflectors 201 in a different direction and therefore incident on a different reflector of the second array of reflectors 202. In this case, the radiation of the undesired wavelength reflects from the reflector of the second array of reflectors 202 on which it is incident in such a manner that it does not form a part of the conditioned beam of radiation 203.

In a preferred arrangement, as depicted in FIG. 6, a radiation absorber 204 is provided that is configured to absorb the radiation of the undesired wavelengths that is reflected in a direction such that it does not form part of the conditioned beam of radiation 203. For example, the radiation absorber 204 may be arranged in the form of an aperture that permits radiation of the desired wavelength that has been reflected in a first direction, to pass through the aperture to form the conditioned beam of radiation 203 but absorbs radiation of the undesired wavelength that is reflected in a different direction.

It should be appreciated that in an arrangement such as that depicted in FIG. 6, radiation having undesired wavelengths may be reflected by each of the reflectors of the first array of reflectors 201 onto a plurality of reflectors of the second array of reflectors 202. In addition, each of the reflectors of the second array of reflectors 202 may both receive radiation from a first reflector in the first array of reflectors 201 having the desired wavelength, reflecting such desired radiation such that it is included in the conditioned beam of radiation 203, and receive radiation from one or more other reflectors of the first array of reflectors 201 that has an undesired wavelength, reflecting such undesired radiation such that it does not form part of the conditioned beam of radiation 203.

Figure 7:
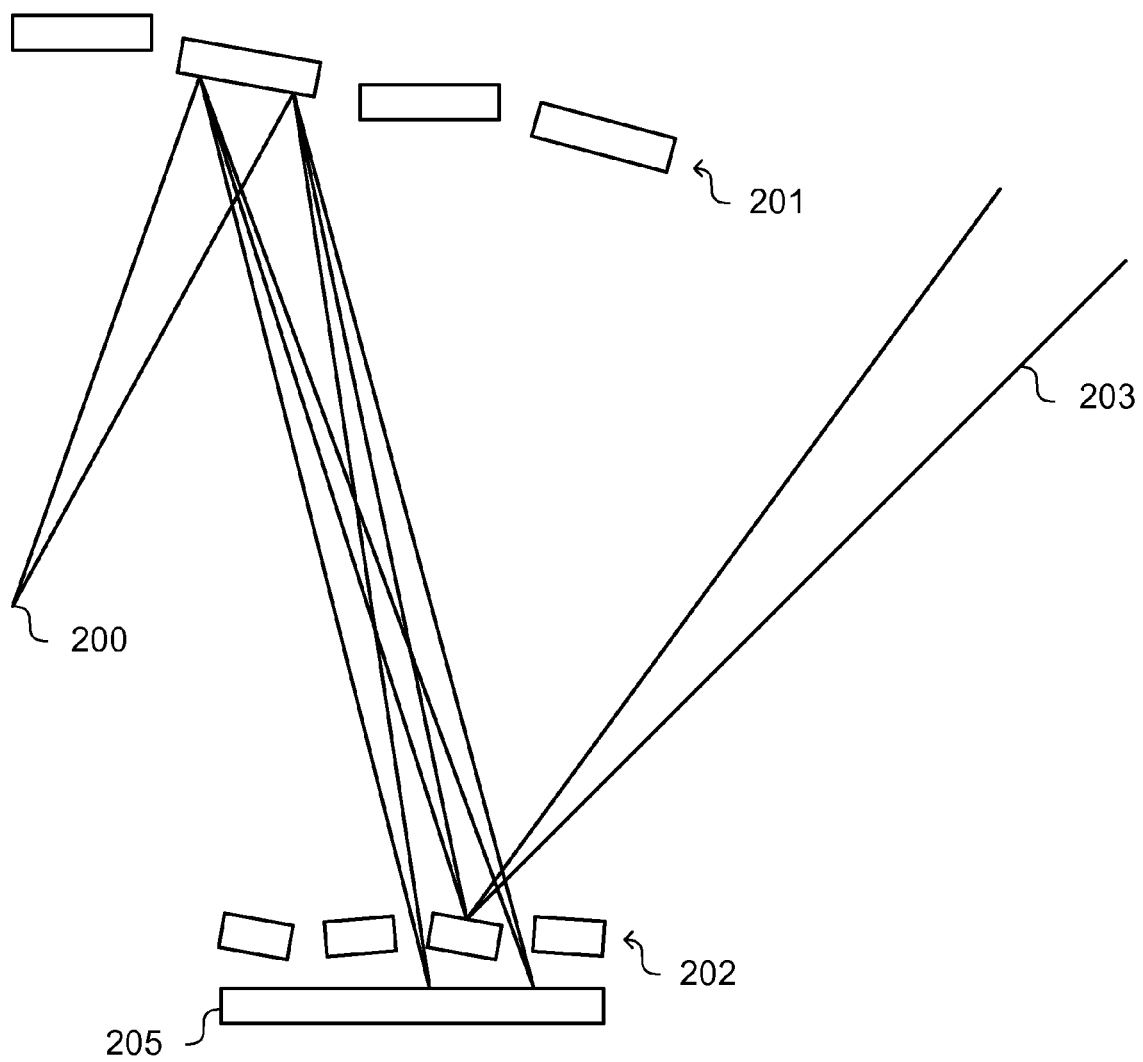
FIG. 7 depicts a variant of the arrangement depicted in FIG. 6.
Figure 8A:
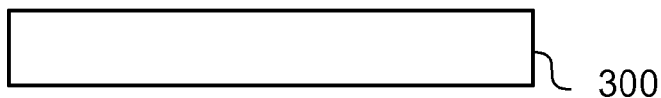
FIGS. 8a to 8g depict a method of forming a spectral purity filter.
Figure 8B:
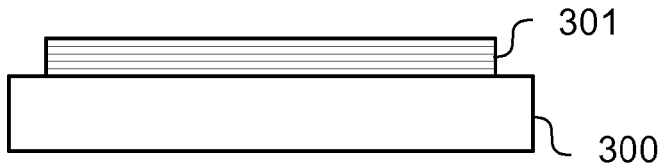
Figure 8C:
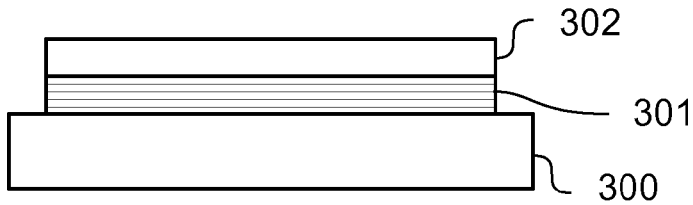
Figure 8D:
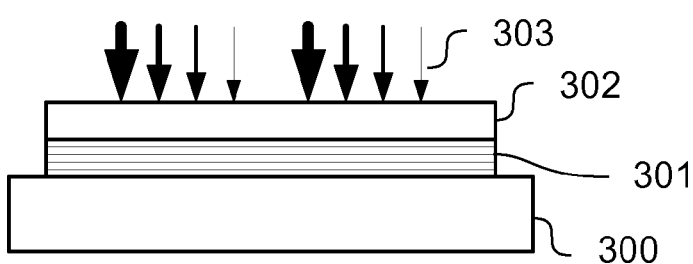
Figure 8E:
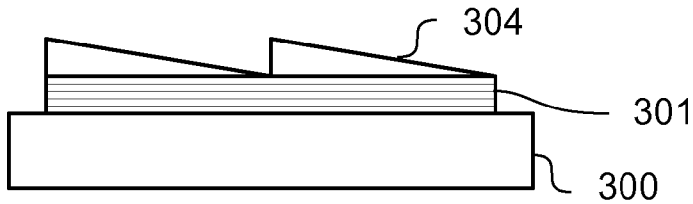
Figure 8F:
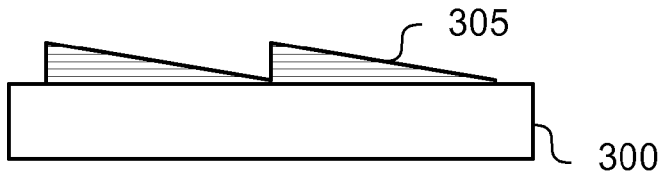
Figure 8G:
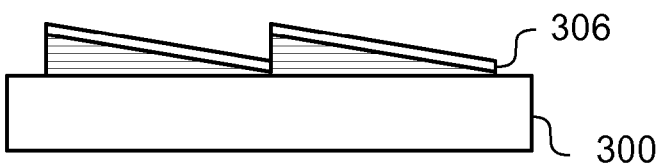

FIG. 7 schematically depicts an arrangement that is similar to the arrangement depicted in FIG. 6. Accordingly, description of corresponding features will be omitted for brevity. The difference between the arrangement depicted in FIG. 7 and the arrangement depicted in FIG. 6 is that the first and second arrays of reflectors 201,202 are configured such that the radiation of undesired wavelengths is reflected from each reflector of the first array of reflectors 201 such that the radiation is directed to a space between two of the reflectors of the second array of reflectors 202. Accordingly, only radiation of the desired wavelength is reflected by the reflectors of the first array of reflectors 201 onto the reflectors of the second array of reflectors 202 and subsequently form part of the conditioned beam of radiation 203. As shown in FIG. 7, a radiation absorber 205 may be provided on the opposite side of the second array of reflectors 202 from the first array of reflectors 201. The radiation absorber 205 may be configured to absorb the radiation of the undesired wavelengths that passes between the reflectors of the second array of reflectors 202.

The radiation absorbers 204; 205 of the arrangements depicted in arrangements depicted in FIGS. 6 and 7 may be provided with a cooling system in order to dissipate the heat resulting from the absorption of the radiation of the undesired wavelengths.

It should also be appreciated that, although the arrangements depicted in FIGS. 6 and 7 are such that the spectral purity filters are provided on the reflectors of the first array of reflectors 201, alternative arrangements may be provided in which the spectral purity filters are alternatively or additionally provided on the reflectors of the second array of reflectors 202. In either case, the spectral purity filters may be arranged such that radiation of the desired wavelength is directed such that it forms the conditioned beam of radiation while radiation having undesired wavelengths is directed in one or more different directions and may be absorbed by an appropriate radiation absorber.

The arrangements of FIGS. 6 and 7 may beneficially prevent undesired wavelengths of radiation from passing into the remainder of a lithographic apparatus. In addition, it may be easier to form the spectral purity filters on the reflectors of the arrays of reflectors used in the radiation beam conditioning system than it is to form the spectral purity filter on, for example, the collector mirrors as discussed above. Furthermore, the environment within which the collector mirrors operate may be such that the useful lifetime of the spectral purity filter formed on the collector mirror may be shorter than the useful lifetime of the spectral purity filter when formed on the reflectors of the radiation beam conditioning system depicted in FIGS. 6 and 7.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be understood that in the present application, the term "including" does not exclude other elements or steps. Also, each of the terms "a" and "an" does not exclude a plurality. Any reference sign(s) in the claims shall not be construed as limiting the scope of the claims.

What is claimed is:

1. A method of forming a spectral purity filter, comprising:
   providing on a surface of a substrate a multilayer stack comprising a plurality of alternating layers, the multilayer stack being configured to be reflective to extreme ultraviolet radiation;
   forming a layer of radiation sensitive material on the multilayer stack;
   exposing an interference pattern of radiation on the radiation sensitive material;
   developing the radiation sensitive material to form a patterned mask on the multilayer stack;
   etching the surface of the multilayer stack on which the mask is formed in order to form a textured surface; and
   forming a coating on the multilayer stack.

2. The method of forming a spectral purity filter according to claim 1, wherein the coating comprises a metal selected from the group consisting of Ru, Pd, Pt, Rh, Ro, Ti, Au, Mo, Zr, Cu, Fe, Cr, Ni, Zn, and Ag.

3. The method of forming a spectral purity filter according to claim 2, wherein the metal is selected from the group consisting of Ru, Pd, Pt, Rh, Ro, Ti and Au.

4. The method of forming a spectral purity filter according to claim 3, wherein the coating has a thickness of about 0.2 nm to about 1 nm.

5. The method of forming a spectral purity filter according to claim 4, wherein the interference pattern is formed from a narrowband source of UV radiation.

6. The method of forming a spectral purity filter according to claim 3, wherein the interference pattern is formed from a narrowband source of UV radiation.

7. The method of forming a spectral purity filter according to claim 2, wherein the coating has a thickness of about 0.2 nm to about 1 nm.

8. The method of forming a spectral purity filter according to claim 7, wherein the interference pattern is formed from a narrowband source of UV radiation.

9. The method of forming a spectral purity filter according to claim 2, wherein the interference pattern is formed from a narrowband source of UV radiation.

10. The method of forming a spectral purity filter according to claim 1, wherein the coating has a thickness of about 0.2 nm to about 1 nm.

11. The method of forming a spectral purity filter according to claim 10, wherein the interference pattern is formed from a narrowband source of UV radiation.

12. The method of forming a spectral purity filter according to claim 1, wherein the interference pattern is formed from a narrowband source of UV radiation.

13. The method of forming a spectral purity filter according to claim 12, wherein the interference pattern is formed using an etalon.

14. A method of forming a spectral purity filter, comprising:
   providing on a surface of a substrate a multilayer stack comprising a plurality of alternating layers, the multilayer stack being configured to be reflective to extreme ultraviolet radiation;
   forming a layer of radiation sensitive material on the multilayer stack;
   forming an interference pattern of radiation from a narrowband source of UV radiation using an etalon;
   projecting the interference pattern of radiation on the radiation sensitive material;
   developing the radiation sensitive material to form a patterned mask on the multilayer stack; and
   etching the surface of the multilayer stack on which the mask is formed in order to form a textured surface.

15. The method of forming a spectral purity filter according to claim 14, further comprising forming a coating on the multilayer stack.

16. The method of forming a spectral purity filter according to claim 15, wherein the coating comprises a metal selected from the group consisting of Ru, Pd, Pt, Rh, Ro, Ti, Au, Mo, Zr, Cu, Fe, Cr, Ni, Zn, and Ag.

17. The method of forming a spectral purity filter according to claim 16, wherein the metal is selected from the group consisting of Ru, Pd, Pt, Rh, Ro, Ti and Au.

18. The method of forming a spectral purity filter according to claim 15, wherein the coating has a thickness of about 0.2 nm to about 1 nm.

19. The method of forming a spectral purity filter according to claim 14, wherein forming the interference pattern comprises filtering radiation from a UV source with a narrow band filter, and passing the filtered UV radiation through the etalon.

20. The method of forming a spectral purity filter according to claim 14, wherein projecting the interference pattern comprises passing the interference pattern of radiation through an optical element.

\* \* \* \* \*